United States Patent [19]
Ostman et al.

[11] Patent Number: 5,572,452
[45] Date of Patent: Nov. 5, 1996

[54] FILTER WITH FEED-FORWARD AGC

[75] Inventors: Leif T. Östman, Spånga; Magnus A. H. Gustafsson; Anders W. Järleholm, both of Sollentuna, all of Sweden

[73] Assignee: Telefonaktiebolaget LM Ericsson, Stockholm, Sweden

[21] Appl. No.: 383,589

[22] Filed: Feb. 3, 1995

[51] Int. Cl.$^6$ ........................................ G06F 7/38
[52] U.S. Cl. ........................ 364/724.16; 73/900
[58] Field of Search ................. 364/715.01, 715.02, 364/715.03, 724.16, 715.04, 724.01; 73/900; 342/91, 92; 375/345; 455/136, 138, 245, 75

[56] References Cited

U.S. PATENT DOCUMENTS

| | | | |
|---|---|---|---|
| 4,021,739 | 5/1977 | Baum et al. | 375/317 |
| 4,439,864 | 3/1984 | Qureshi | 375/345 |
| 4,680,588 | 7/1987 | Cantwell | 342/92 |
| 4,710,772 | 12/1987 | Cantwell et al. | 342/92 |
| 4,801,939 | 1/1989 | Jones | 342/25 |
| 4,901,333 | 2/1990 | Hodgkiss | 375/345 |
| 4,959,619 | 9/1990 | Delacroise et al. | 329/306 |
| 5,134,722 | 7/1992 | Emslie et al. | 455/249.1 |
| 5,204,976 | 4/1993 | Baldwin et al. | 455/234.2 |
| 5,291,525 | 3/1994 | Funderburk et al. | 375/345 |
| 5,351,016 | 9/1994 | Dent | 332/103 |
| 5,422,909 | 6/1995 | Love et al. | 375/200 |

FOREIGN PATENT DOCUMENTS

| | | |
|---|---|---|
| 482927 | 4/1992 | European Pat. Off. |
| 3047447 | 9/1981 | Germany |
| 92/03892 | 3/1992 | WIPO |

*Primary Examiner*—Tan V. Mai
*Assistant Examiner*—Chuong D. Ngo
*Attorney, Agent, or Firm*—Burns, Doane, Swecker & Mathis, L.L.P.

[57] ABSTRACT

A device and method are provided for fully realizing the precision gained internally from a conventional digital signal processor by generating a feed forward automatic gain control (AGC) signal. The feed forward AGC bit is indicative of the output of the digital signal processor being multiplied by a gain factor when the output from the digital filter included in the digital signal processor is below a threshold value. When the feed forward AGC signal is received by an inphase and quadrature (I/Q)-to-(logR/φ) converter connected to the digital signal processor, a corresponding value is subtracted from the radius component of the signal calculated by the (I/Q)-to-(logR/φ) converter. Because conventional digital signal processors have 16 IO bits, the feed forward AGC signal allows an input signal with a dynamic range and precision exceeding 16 bits to be transferred from the digital signal processor without loosing performance. As a result, a digital signal processor with a fewer number of IO bits than is nominally required for the precision and dynamic range of the output signal is implemented.

28 Claims, 2 Drawing Sheets

FILTER WITH FEED-FORWARD AGC

BACKGROUND

The present invention is directed to a device for transferring a signal of a desired dynamic range and precision over a link having a precision which is less than the precision of the desired signal without loosing performance of the transmitted signal. More particularly, the present invention is directed to realizing the internally gained precision of a signal processed in a digital signal processor (DSP) with a smaller amount of IO bits than is nominally required for realizing the precision and dynamic range.

Presently, analog components of receivers have been replaced with digital technology in order to reduce the number of components, to improve the product yield and to reduce the manufacturing costs. In implementing digital technology for a receiver, the required number of bits for outputting data is dictated by the desired precision of the output signal. An important part of the receiver is the filter component which reduces the bandwidth of the signal after filtering and improves the precision of the outputted signal. The improved precision of the output signal is expressed as process gain. The process gain can be calculated according to the equation:

$$PB=10*\log (fbin/fbout)$$

where PB=the process gain in dB, fbin=the bandwidth of the input signal to the filter and fbout=the bandwidth of the output signal from the filter.

When selecting a DSP for an application, many factors are considered. In selecting a DSP, the choice of a fixed point or a floating point DSP is usually dictated by the requirements of the algorithms such as the dynamic range and accuracy. However, a compromise between various other requirements of speed, precision, program/data memory space, power consumption, cost, ease of use and available technical support for the device often leads to the selection of a particular device. Based upon these considerations, a fixed point DSP is typically used to implement the filter. In conventional and commonly used DSPs, such as TMS 320C25 and TMS 320C50 (from TI) and DSP16 (from AT & T), the number of IO bits is limited to 16 even though the number of bits internal to the DSPs is more than 16 bits.

In digital implementation, the required number of bits corresponds to the desired precision of the signal. For example, for input data with 14 bit precision and a process gain in the filter of 24 dB or four bits (where 24 dB=4 bits×6.02) with 6.02 being the theoretical conversion factor for an A/D converter, the precision of the internal data is 18 bits. However, in conventional DSPs having 16 IO bits, the precision and the output data is limited to the 16 IO bits and the 18 bit precision of the internal data will, therefore, not be fully realized.

One solution for realizing the full internal precision is to use a DSP with more than 16 IO bits. The disadvantages associated with using DSPs with more than 16 IO bits are increased component cost, higher bandwidth requirements on the serial IO interfaces and a reduced number of available components. Another solution to the problem of realizing the increased precision for the internal data in the DSP is to split the data into two or more words. However, when splitting the data into two or more words, a higher bandwidth is required in the serial IO interface and the DSP power required to split data is increased. Accordingly, it is desired to transfer a signal having a dynamic range and precision exceeding 16 bits over a 16 bit link without loosing performance of the signal.

SUMMARY

An object of the present invention is to fully realize the gained precision in a digital signal processor from the digital filter included therein.

Another object of the present invention is to provide a digital signal processor having a fewer number of IO bits than is nominally required for the precision and dynamic range gained internally by the digital signal processor.

A still further object of the present invention is to transfer on a conventional 16 bit link for digital signal processors a signal having a dynamic range and precision gained internally from the digital signal processor which exceeds 16 bits without loosing performance of the signal.

These objects of the present invention are fulfilled by providing a device for transferring a processed signal having a predetermined dynamic range, comprising a digital signal processor for developing the processed signal responsive to a digitally sampled signal input thereto and generating an information bit on a sample-to-sample basis indicative of the digitally sampled signal being multiplied by an amplification factor, and an (I/Q)-to-(logR/φ) converter for modifying the processed signal in response to the information bit generated by the digital signal processor so that the precision of the predetermined dynamic range of the processed signal is achieved. In this device, automatic gain control is performed for the full bandwidth of the signal and the automatic gain control is used to gain maximal resolution of the output values from a digital filter internal to the digital signal processor and compensation may be performed for the gain controlled data.

These objects of the present invention are also fulfilled by providing a method for transferring a process signal having a predetermined dynamic range, comprising the steps of receiving a digitally sampled signal with a digital signal processor, developing the processed signal by the digital signal processor responsive to the digitally sampled signal received, generating an information bit by the digital signal processor indicative of the digitally sampled signal being multiplied by an amplification factor on a sample-to-sample basis, and modifying the processed signal in response to the information bit generated so that the precision of the predetermined dynamic range of the processed signal is achieved. This method similarly allows the internally gained precision of the digital signal processor to be realized by using a fewer number of IO bits than is nominally required for the precision and dynamic range of the signal.

Further scope of applicability of the present invention will become apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

DRAWINGS

The present invention will become more fully understood from the detailed description given hereinbelow and the accompanying drawings which are given by way of illustration only, and thus are not limitative of the present invention, wherein.

DESCRIPTION

Figure 1:
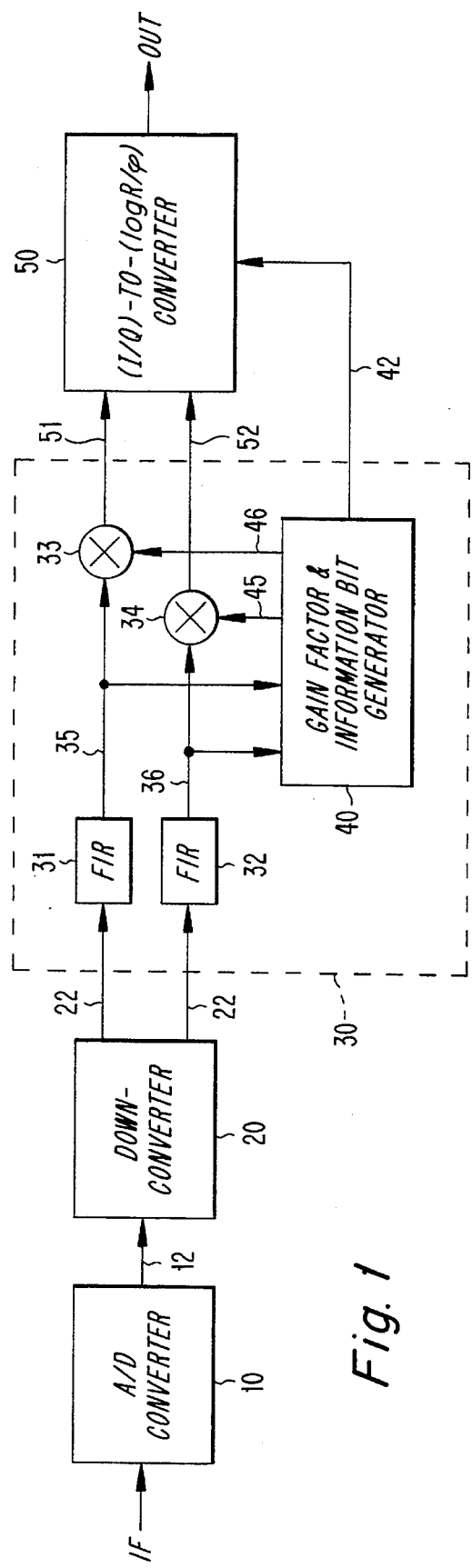
FIG. 1 illustrates a block diagram of a wideband receiver for an embodiment of the present invention.

FIG. 1 illustrates a wideband receiver with digital filtering and feed forward automatic gain control for an embodiment of the present invention. FIG. 1 includes an analog-to-digital (A/D) converter 10 which receives an intermediate frequency (IF) signal and digitizes this IF signal, a down converter 20 which receives the digitized signal from the A/D converter 10 over a link 12 and converts the digitized signal received to baseband inphase and quadrature (I and Q) signals and performs lowpass filtering, a digital signal processor (DSP) 30 which receives the signal from the down converter 20 over a link 22, a gain factor and information bit generator 40 included in the DSP 30 which generates a gain factor and an information bit, and an (I/Q)-to-(logR/φ) converter 50 which receives the output from the DSP 30 over links 51 and 52 and the information bit from the information bit generator 40 over a link 42.

The structure of the DSP 30 typically includes first and second finite impulse response (FIR) filters 31 and 32 which receives the IQ data over the link 22 and first and second multipliers 33 and 34 which receive the outputs of the first and second FIR filters 31 and 32 over links 35 and 36, and the gain factor over links 45 and 46, respectively. The first and second multipliers 33 and 34 provide the outputs to the (I/Q)-to-(logR/φ) converter 50 over the links 51 and 52. Also, the information bit generator 40 included in the DSP 30 generates the information bit in response to the outputs of the first and second FIR filters 31 and 32 over the links 35 and 36. The (I/Q)-to-(logR/φ) converter 50 calculates radius and phase components from the outputs of the DSP 30 over the links 51 and 52. The phase value component is calculated according to the equation arctan (Q/I) and the radius value component is calculated according to the equation log $\sqrt{(\sqrt{I^2+Q^2})}$ where I and Q correspond to values of the baseband I and Q signals.

An example of the operation for the wideband receiver with digital filtering and feed forward automatic gain control (AGC) for an embodiment of the present invention will be discussed with reference to specific data, sampling and structure. The IF signal is input to the A/D converter 10 and is sampled at 38.88 MSa/s with the output signal at link 12 having a bandwidth of 19.44 MHz and a 12 bit resolution. This real data is received by the downconverter 20 which converts the real data to IQ data at a sampling rate of 194.4 kSa/s having a bandwidth of 97.2 kHz and a 15.8 bit resolution. The 15.8 bit resolution is calculated by using the process gain equation and the theoretical factor of 6.02 for digital conversion. In particular, the process gain=10 log 19.44 MHz/97.2 kHz=23.0 dB=3.8 bits. Therefore, the precision of 15.8 bits=the 12 bit output of the A/D converter 10+3.8 bit process gain. Next, the IQ data is input to the DSP 30, such as conventional 16 bit DSPs (TMS 320C25, TMS 320C50 and DSP 16) over the link 22. The IQ data output from the DSP 30 over the links 51 and 52 develops processed IQ data from a sampling rate of 194.4 kSa/s with a 30 kHz bandwidth and 16.7 bit resolution. The 16.7 bit resolution is determined by calculating the process gain=10 log 97.2 kHz/30 kHz=5.1 dB=0.9 bits. Therefore, the precision and the output from the DSP 30=15.8 bits+0.9 bits= 16.7 bits.

Figure 2:
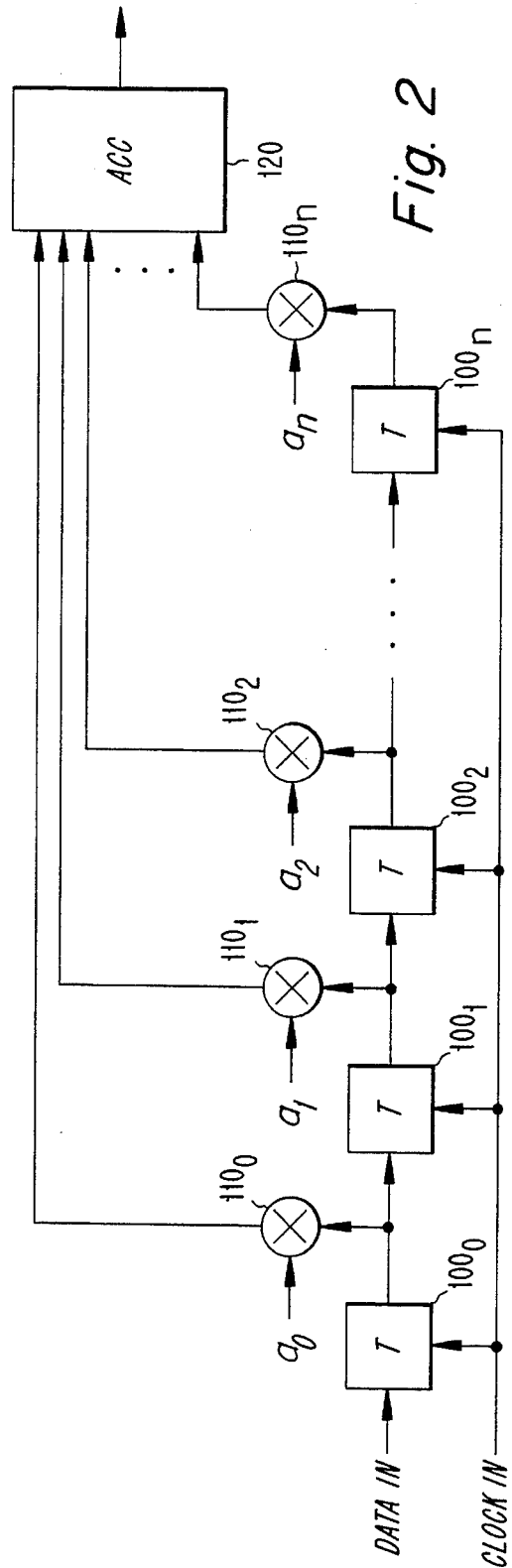
FIG. 2 illustrates a general finite impulse response filter structure used in the digital signal processor of FIG. 1.

FIG. 2 illustrates a general FIR filter structure used in the DSP 30 for an embodiment of the present invention. The general FIR filter structure includes a plurality of taps $100_0$, $100_1$, $100_2$ ... $100_n$ having a clock signal at one input of each of the plurality of taps $100_0$, ... $100_n$ and data sequentially stepped through each of the taps $100_0$, ... $100_n$ in order at another input of the taps $100_0$, $100_n$, and a plurality of multipliers $110_0$, $110_1$ ... $110_n$ having weighting signals $a_0$, $a_1$ ... $a_n$ and the outputs from the taps respectively input thereto. The outputs of the multipliers $110_0$, ... $110_n$ are input to an accumulator 120. In conventional 16 IO bit DSPs, accumulators are 32 bits wide and therefore data from the accumulators have the precision gain from the filter. Each of the taps functions to delay the input data by one clock function. The input data to the taps may be I or Q data and the frequency of the clock signal may be 194.4 kHz in correspondence to the specific data discussed in the example above. Typically, the number of taps n=80–90. The weighting signals $a_0$, ... $a_n$ are derived from the DSP 30 realizing a low pass filter having a specific frequency function. The specific frequency function is transformed by a Fourier transform to generate a time domain function. The weighting signals $a_0$, ... $a_n$ are derived from the coefficient values of the time domain function. In an example for the specific data discussed above, a frequency function H(f) is developed where H(f)=1 from 1 to 30 kHz and H(f)=0 from 30 to 97.2 kHz. An impulse response h(t) is derived from a Fourier transform of the frequency function H(f) and the weighting signals $a_0$, ... $a_n$ are obtained from the impulse function h(t).

Because the output data from the DSP 30 is transferred to the (I/Q)-to-(logR/φ) converter 50 on a 16 bit bus, the gain factor and information bit generator 40 provides a feed forward AGC bit so that the precision gained in the DSP 30 may be fully realized. The gain factor and information bit generator 40 compares the outputs of the first and second FIR filters 31 and 32 received over the links 35 and 36 with a threshold value. In particular, with reference to FIG. 2, the outputs of the accumulators 120 corresponding to the FIR filters are received by the gain factor and information bit generator 40. When the result of this comparison is below the threshold value, the outputs from the DSP 30 received by the (I/Q)-to-(logR/φ) converter 50 over the links 51 and 52 are multiplied with an amplification factor. Also, when the result of this comparison is below the threshold value, this state is indicated to the (I/Q)-to-(logR/φ) converter 50 by a feed forward AGC signal developed by the gain factor and information bit generator 40 and sent over the link 42 to the (I/Q)-to-(logR/φ) converter 50. The (I/Q)-to-(logR/φ) converter 50 converts the output signal from the DSP 30 to a phase component=arctan (Q/I) and a radius component=log (SQRT (I×I+Q×Q)). When the feed forward AGC is active, the converter compensates the calculated radius component c for multiplication in the DSP 30.

The amplification factor used by the gain factor and information bit generator 40 depends on the number of bits that are "out of scale." In the specific data example discussed above wherein 16.7 bits exceed the 16 IO bits, one bit would nominally be enough to correct this "out of scale" condition, but it is desirable to have some margin. For instance, a margin of 3.3 bits which provides an amplification factor of four bits may be chosen. The four bits correspond to the value of $2^4=16$ such that the amplification factor equals 16 for this chosen margin. However, this amplification factor is generally arbitrary and it is not critical that the amplification factor precisely equals 16, an appropriate amplification factor may be anywhere between 2 and 64.

The threshold value is calculated from the amplification factor according to the equation: threshold value=full scale−(amplification factor+margin). Thus, if the amplification factor is chosen to be 16, the threshold value is determined from the margin=1 bit (that gives up to a one bit overflow), a full scale=$2^{16}-1=65,536$. As a result, the threshold=$2^{(16-(4+1))}-1=2,047$. Thereby, if data is below this threshold, it will be multiplied with the amplification factor of 16. The compensation by the (I/Q)-to-(logR/φ) converter 50 for the multiplication by the amplification factor corresponds to a division function where the denominator of this division function is equal to the amplification factor which was used in the multiplication by the DSP 30. However, because the R value that is to be divided has been subjected to a logarithmic operation by the (I/Q)-to-(logR/φ) converter 50, the logarithmic domain division corresponds to a subtraction function so that the compensation is achieved by subtracting from log R. The subtraction value is calculated from the logarithmic value of the amplification factor. For example, when the amplification factor equals 16=24, a subtraction value of 20 log 16 dB which is approximately equal to 24 dB is used. The precision is gained by conversion into the logarithmic domain because it takes less bits to represent the signal in this domain.

Figure 3:
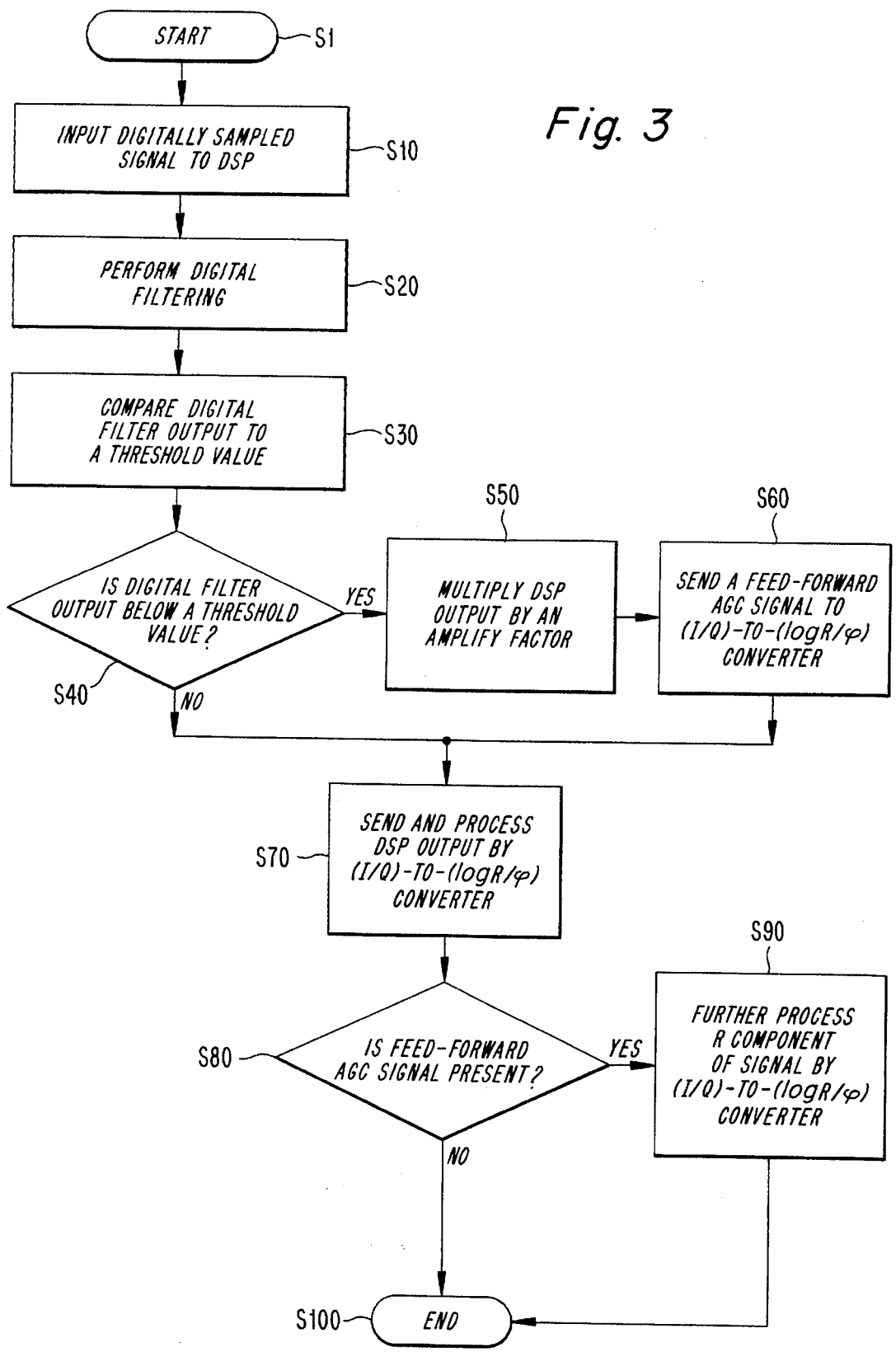
FIG. 3 illustrates a flow chart for generating a feed forward automatic gain control bit in an embodiment of the present invention.

FIG. 3 illustrates a flow chart of the feed forward automatic gain control for an embodiment of the present invention. At step S10, a digital signal generated on a sample-to-sample basis is received by a conventional DSP 30. The DSP 30 performs digital filtering on the digitally sampled signal at step S20 and compares the output of the digital filter to a threshold value at step S30. Step S40 determines whether the output of the digital filter is below a threshold value. If the output is below the threshold value, the output of the DSP is multiplied by an amplification factor at step S50 and a feed forward AGC signal is sent to the I/Q converter at step S60. Next, at step S70, the output signals of the DSP 30 are sent to the (I/Q)-to-(logR/φ) converter 50 after the feed forward AGC signal is sent and also when the output is not below a threshold value. The (I/Q)-to-(logR/φ) converter 50 processes the output signal from the DSP 30 into phase and radius components at step S70. Step S80 then determines whether the feed forward AGC signal is present. If the feed forward AGC signal is present, the (I/Q)-to-(logR/φ) converter 50 further processes the radius component by subtracting a corresponding value before the process ends at step S100. If the feed forward signal is not present, the process ends after step S80.

Accordingly, the embodiments of the present invention provide a device and method which fully realizes the gained precision from a digital signal processor by implementing the digital signal processor with a fewer number of IO bits than is nominally required by conventional digital signal processors for the internally increased precision and dynamic range. This device and method reduces the component costs as compared with conventional digital signal processors. Also, the selection of digital signal processors in a particular design is not limited by the number of IO bits in the digital signal processor.

The invention being thus described, it will be obvious that the same may be varied in many ways. Such variations are not to be regarded as a departure from the spirit and scope of the invention, and also such modifications that would be obvious to one skilled in the art are intended to be included within the scope of the following claims.

What is claimed is:

1. A device for transferring a processed signal having a predetermined dynamic range comprising:

a signal converter for converting a digitized signal into a digitally sampled signal having baseband inphase and quadrature (I/Q) signal components;

a digital signal processor for developing the processed signal responsive to said digitally sampled signal input thereto, said digital signal processor including multiplying means for multiplying said digitally sampled signal by an amplification factor when said digitally sampled signal is below a threshold value, and said digital signal processor generates an information bit on a sample to sample basis indicative of the processed signal being multiplied by said amplification factor; and an (I/Q)-to-(logR/φ) converter for modifying the processed signal in response to said information bit generated by said digital signal processor so that the precision of the predetermined dynamic range of the processed signal is achieved.

2. A device according to claim 1, wherein said signal converter comprises an A/D converter for converting an intermediate frequency signal input thereto into said digitized signal.

3. A device according to claim 1, wherein said signal converter comprises a down converter for converting said digitized signal into said digitally sampled signal having baseband inphase and quadrature (I/Q) signal components and low pass filtering said digitally sampled signal.

4. A device according to claim 1, wherein said digital signal processor comprises a comparator for comparing said digitally sampled signal with a threshold value and said multiplying means multiplies said digitally sampled signal by said amplification factor when said comparator determines that said digitally sampled signal is below said threshold value.

5. A device according to claim 4, wherein said digital signal processor comprises finite impulse response (FIR) low pass filters for receiving said digitally sampled signal and performing a time domain function thereto.

6. A device according to claim 5, wherein each of said FIR low pass filters comprises a plurality of multipliers and taps and an accumulator, each said accumulator outputting a signal to said comparator.

7. A device according to claim 1, wherein said digital signal processor comprises an information bit generator for generating said information bit in response to said digitally sampled signal being multiplied by said amplification factor.

8. A device according to claim 1, wherein said (I/Q)-to-(logR/φ) converter and said digital signal processor are connected by a 16 bit bus.

9. A device according to claim 1, wherein said (I/Q)-to-(logR/φ) converter calculates radius and phase values.

10. A device according to claim 9, wherein said phase value is calculated according to the equation arctan (Q/I) and said radius value is calculated according to the equation $$\log(\sqrt{I^2+Q^2}\ )$$

where I and Q correspond to values of said baseband I/Q signals.

11. A device according to claim 10, wherein said (I/Q)-to-(logR/φ) converter modifies the processed signals by subtracting a predetermined value from said radius value in response to said information bit being received from said digital signal processor.

12. A wideband receiver comprising:
   an A/D converter for digitizing an intermediate frequency signal input thereto and outputting a digital signal;
   a down converter for converting said digital signal to baseband inphase and quadrature (I/Q) signals and low pass filtering said baseband I/Q signals to generate a digitally sampled signal;
   a digital signal processor for developing a processed signal from said digitally sampled signal input thereto, said digital signal processor including multiplying means for multiplying said digitally sampled signal by an amplification factor when said digitally sampled signal is below a threshold value, and said digital signal processor generates an information bit on a sample to sample basis indicative of the processed signal being multiplied by said amplification factor; and
   an (I/Q)-to-(logR/φ) converter for modifying said processed signal received in response to said information bit generated by said digital signal processor so that the precision for the dynamic range of said processed signal is achieved.

13. A wideband receiver according to claim 12, wherein said digital signal processor comprises a comparator for comparing said digitally sampled signal with a threshold value and said multiplying means multiplies said digitally sampled signal by said amplification factor when said digitally sampled signal is below said threshold value.

14. A wideband receiver according to claim 13, wherein said digital signal processor comprises a finite impulse response (FIR) low pass filters for receiving said digitally sampled signal and performing a time domain function thereto.

15. A wideband receiver according to claim 14, wherein each of said FIR low pass filters comprises a plurality of multipliers and taps and an accumulator, each said accumulator outputting a signal to said comparator.

16. A wideband receiver according to claim 12, wherein said digital signal processor comprises an information bit generator for generating said information bit responsive to said digitally sampled signal being multiplied by said amplification factor.

17. A wideband receiver according to claim 12, wherein said digital signal output from said A/D converter has a precision of a first predetermined number of bits.

18. A wideband receiver according to claim 17, wherein said digitally sampled signal output from said down converter has a precision of a second predetermined number of bits which is greater than said first predetermined number of bits.

19. A wideband receiver according to claim 18, wherein said processed signal output from said digital signal processor has a precision of a third predetermined number of bits which is greater than said second predetermined number of bits.

20. A wideband receiver according to claim 12, wherein said (I/Q)-to-(logR/φ) converter and said digital signal processor are connected by a 16 bit bus.

21. A wideband receiver according to claim 12, wherein said (I/Q)-to-(logR/φ) converter calculates radius and phase values.

22. A wideband receiver according to claim 12, wherein said phase value is calculated according to the equation arctan (Q/I) and said radius value is calculated according to the equation $$\log(\sqrt{I^2+Q^2}\ )$$

where I and Q correspond to values of said baseband I/Q signals.

23. A wideband receiver according to claim 12, wherein said (I/Q)-to-(logR/φ) converter modifies said processed signals by compensating for multiplication in said digital signal processor in response to said information bit being received from said digital signal processor.

24. A method for transferring a processed signal having a predetermined dynamic range comprising the steps of:
   (a) converting a digitized signal into a digitally sampled signal having baseband inphase and quadrature (I/O) signal components with a digital signal processor;
   (b) developing the processed signal responsive to said digitally sampled signal received at said step (a) with said digital signal processor by multiplying said digitally sampled signal by an amplification factor when said digitally sampled signal is below a threshold value;
   (c) generating an information bit by said digital signal processor indicative of the processed signal being multiplied by said amplification factor on a sample to sample basis; and
   (d) modifying the processed signal in response to said information bit generated at said step (c) by (I/O)-to-(log R/φ) conversion so that the precision of the predetermined dynamic range of the processed signal is achieved.

25. A method according to claim 24, further comprising the steps of converting a digitized signal into baseband inphase and quadrature (I/Q) signals and low pass filtering said baseband I/Q signals to develop said digitally sampled signal.

26. A method according to claim 25, wherein said step (d) modifies the processed signal by calculating phase and radius values according to the equation arctan (Q/I) for said phase values and the equation $$\log(\sqrt{I^2+Q^2}\ )$$

for said radius values where I and Q correspond to values of said baseband I/Q signals.

27. A method according to claim 24, wherein said step (c) further includes the steps of:
   (c)(1) receiving said digitally sampled signals by finite impulse response (FIR) low pass filters and performing a time domain function thereto;
   (c)(2) comparing outputs of said FIR low pass filters included in said digital signal processor with a threshold value;
   (c)(3) multiplying said digitally sampled signal by said amplification factor when said step (c)(2) determines that said outputs of said FIR low pass filters are below said threshold value; and
   (c)(4) generating said information bit responsive to said digitally sampled signal being multiplied at said step (c)(3).

28. A method according to claim 24, wherein said step (d) modifies the processed signals by compensating for multiplication in said digital signal processor in response to said information bit being generated at said step (c).

\* \* \* \* \*